(12) United States Patent
Ichikawa

(10) Patent No.: US 7,039,373 B2
(45) Date of Patent: May 2, 2006

(54) WIRELESS COMMUNICATION APPARATUS AND TRANSMISSION POWER CONTROL METHOD THEREOF

(75) Inventor: Yasufumi Ichikawa, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 458 days.

(21) Appl. No.: 09/777,044

(22) Filed: Feb. 5, 2001

(65) Prior Publication Data

US 2001/0012766 A1 Aug. 9, 2001

(30) Foreign Application Priority Data

Feb. 7, 2000 (JP) .................... P. 2000-029167

(51) Int. Cl.
*H04B 1/04* (2006.01)
(52) U.S. Cl. .................... 455/127.3; 455/126; 455/522
(58) Field of Classification Search ........... 455/522, 455/68, 69, 126, 120, 134, 135, 127.1–127.4; 370/316, 318, 320, 321; 375/138, 295, 316
See application file for complete search history.

(56) References Cited

U.S. PATENT DOCUMENTS

| | | | |
|---|---|---|---|
| 5,056,109 A * | 10/1991 | Gilhousen et al. ............. | 375/1 |
| 5,432,473 A * | 7/1995 | Mattila et al. ....... | 455/127.4 X |
| 5,564,086 A * | 10/1996 | Cygan et al. ................ | 455/126 |
| 5,852,770 A * | 12/1998 | Kasamatsu ................. | 455/126 |
| 5,974,093 A | 10/1999 | Lee | |
| 6,078,794 A * | 6/2000 | Peckham et al. ........ | 455/127.4 |

FOREIGN PATENT DOCUMENTS

| | | | |
|---|---|---|---|
| EP | 0 675 605 A2 | | 10/1995 |
| EP | 1 009 107 A2 | | 6/2000 |
| JP | 07-020790 | * | 8/1996 |
| WO | WO 96/31014 | * | 10/1996 |
| WO | WO 98/36508 | | 8/1998 |
| WO | WO 98/56200 | | 12/1998 |

OTHER PUBLICATIONS

Szu-Lin Su and Shinn-Shyue Shieh, "Reverse-Link Power Control Strategies for CDMA Cellular Network", Department of Electrical Engineering, National Cheng Kung University, R.O.C., 1995, pp. 461-465.

* cited by examiner

*Primary Examiner*—Nay Maung
*Assistant Examiner*—Philip J. Sobutka
(74) *Attorney, Agent, or Firm*—Pearne & Gordon LLP

(57) ABSTRACT

A wireless communication apparatus includes a variable power amplifier (19) and a power amplifier (20). A variable power amplifier control unit (24) controls the gain of the variable power amplifier (19) for controlling transmission power of the own apparatus. At this time, a condition change detecting unit (28) detects changes in conditions of the own station and a counter station. Based upon the detected condition changes, a transmission power control bit controlling unit (26) and a transmission power control period controlling unit (27) change a control period of a transmission power control bit and a transmission power control range. This transmission power control bit is inserted into a transmission signal, then, the transmission signal is transmitted to the counter station. The condition changes are detected based upon reception power, transmission power, the transmission power control bit, a change amount of control conditions, and a change speed of the control conditions.

12 Claims, 5 Drawing Sheets

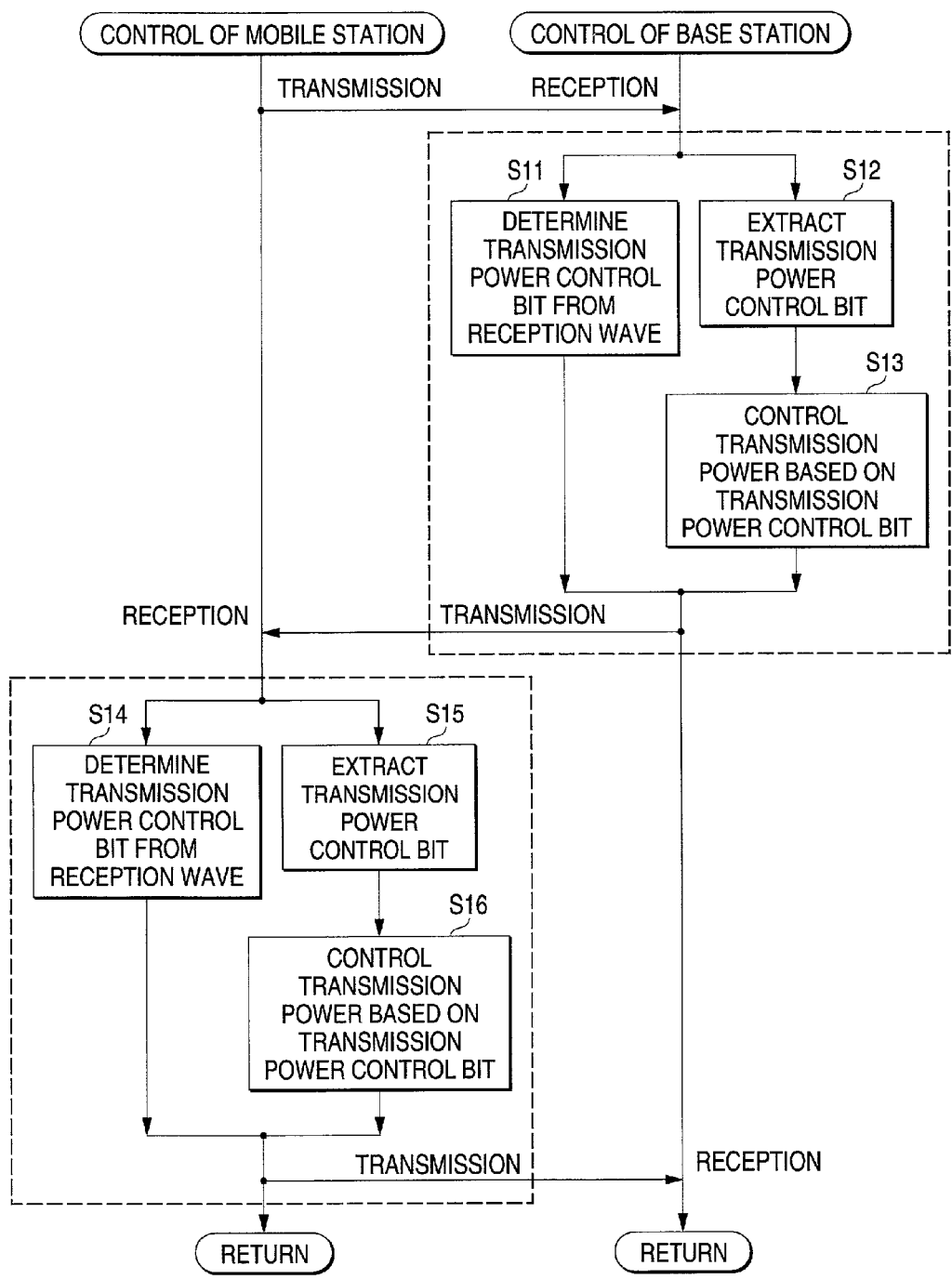

WIRELESS COMMUNICATION APPARATUS AND TRANSMISSION POWER CONTROL METHOD THEREOF

BACKGROUND OF THE INVENTION

The present invention relates to a wireless communication apparatus used in such a mobile communication system that a mobile communication is carried out by employing a portable telephone and the like. More specifically, the present invention is directed to a wireless communication apparatus used in a transmitter, and a transmission power control method executed between a mobile station and a base station in a mobile communication system.

Conventionally, transmission power control techniques are known in such a mobile communication system with employment of a portable telephone and the like. That is, in this mobile communication system, while information is transferred, transmission power of the own mobile station is controlled in response to a distance between a base station and the mobile station so as to maintain constant electric power of a signal reached to the base station. Thus, the transmission power control techniques are capable of reducing interference occurred between communication channels and are capable of improving frequency utilization efficiencies.

In particular, in a CDMA (Code Division Multiple Access) type mobile communication system using the spread spectrum technique, corresponding to one sort of multiple access type communication systems for multiplexing a plurality of communication channels, a single frequency band is commonly used by a plurality of users. As a result, there are large possibilities that a so-called "near-far problem" may occur, namely one communication signal having low electric power may be masked by another communication signal having high electric power. Therefore, the following problem may occur. That is, a communication signal of another communication station may deteriorate as an interference signal wave line quality of the own communication station. To solve this problem, various transmission power control techniques have been conventionally investigated, or considered. More specifically, as the transmission power control systems capable of following interference signals which are instantaneously varied, such a transmission power control system constituted by a closed loop is known in this technical field. In the CDMA communication system, more specifically, the high-linearity transmission power control with the wide dynamic range (for example, 70 to 80 dB) is strongly required. Furthermore, the high precision of transmission power while the high power transmission is carried out is required in the wide-band CDMA (W-CDMA etc.) communication system in IMT-2000, so that the transmission power control is required in higher precision. This wide-band CDMA communication system is presently studied as the next generation mobile communication system.

FIG. 5 is a flow chart for describing one example of the conventional transmission power control method realized by the closed loop. In the case that a base station is communicated with a mobile station, the base station determines a transmission power control bit based upon reception power of a reception signal wave (namely, desirable signal wave) sent from the mobile station (step S11). The base station inserts this determined transmission power control bit into a transmission signal, and then, transmits this resultant transmission signal to the mobile station. The mobile station receives the signal transmitted from the base station, and extracts the transmission power control bit from the received signal (step S15), and then, controls a variable power amplifier employed in the own mobile station in response to the instruction of this transmission power control bit so as to change the transmission power (step S16).

Similarly, the mobile station determines a transmission power control bit based upon reception power of a reception signal wave (namely, desirable signal wave) sent from the base station (step S14). The mobile station inserts this determined transmission power control bit into a transmission signal, and then, transmits this resultant transmission signal to the base station. The base station receives the signal transmitted from the mobile station, and extracts the transmission power control bit from the received signal (step S12), and then, controls a variable power amplifier employed in the own base station in response to the instruction of this transmission power control bit so as to change the transmission power (step S13).

Since such a transmission power control is carried out, the reception power in the base station and also the reception power in the mobile station can be kept substantially constant irrespective of locations of the mobile station.

As previously explained, in order to perform the transmission power control in such high precision in accordance with the conventional transmission power control method, the transmission power control range corresponding to the value (1 unit) of the transmission power control bit is required to be reduced. However, if the transmission power control range is decreased, then the rapid, or sudden variation of the reception power cannot be followed by this conventional transmission power control method. As a result, there is such a problem that the precision of the transmission power control operation is deteriorated.

Also, in order that the transmission power control operation is carried out in such high precision in accordance with the conventional transmission power control method, the variable power amplifier operable in the high precision is necessarily required. Also, the variable power amplifier must be controlled in high precision. However, in the case that such a high-precision variable power amplification control operation is realized by employing the high-precision variable power amplifier, the following problems may occur. That is, the circuit scale is increased, so that the power consumption amount thereof is increased and further, the wireless communication apparatus becomes bulky in size, resulting in deteriorations of portabilities thereof.

SUMMARY OF THE INVENTION

The present invention has been made to solve the above-described problems, and therefore, has an object to provide both a wireless communication apparatus and a transmission power control method, while a transmission power control operation can be carried out in high precision with employment of a simple arrangement, and the wireless communication apparatus can be made compact and operable under low power consumption.

A wireless communication apparatus, according to an aspect of the present invention, is featured by such a wireless communication apparatus having a transmission power control function used to control transmission power of the own communication station by employing a transmission power control bit sent from a communication counter station to the own communication station, comprising a control period changing unit which changes a control period of the transmission power control bit.

Also, preferably, the wireless communication apparatus further comprises a transmission power control range changing unit which changes a transmission power control range corresponding to the transmission power control bit.

Further, preferably, the wireless communication apparatus further comprises: a condition detecting unit which detects either a condition of the own communication station or a condition of the communication counter station; and the control period changing unit changes the control period based upon the detected condition.

Also, preferably, the wireless communication apparatus further comprises: a condition detecting unit which detects either a condition of the own communication station or a condition of the communication counter station; the control period changing unit changes the control period based upon the detected condition; and the transmission power control range changing unit changes the transmission power control range based upon the detected condition.

Also, a wireless communication apparatus, according to another aspect of the present invention, is featured by that in a wireless communication apparatus equipped with first and second power amplifiers for amplifying transmission power transmitted from the own communication station to the communication counter station, and having a transmission power control function used to control the transmission power, the wireless communication apparatus comprises: a power amplification control unit which controls a gain of the first power amplifier; a matching unit which performs a matching operation of a characteristic of the second power amplifier; and a matching control unit which controls the matching unit.

Also, preferably, the wireless communication apparatus further comprises: a transmission power detecting unit which detects transmission power of the own communication station; a transmission power correcting unit which corrects the detected transmission power in response to a communication condition of the own communication station; and an error calculating unit which calculates an error between said corrected transmission power and target transmission power, wherein both the power amplification control unit and the matching control unit execute the control operations thereof based upon the calculated error.

Further, preferably, the wireless communication apparatus further comprises: an error selecting unit which selects an error occurred in an effective control section from the plurality of errors which are calculated over a plurality of control sections; and both the power amplification control unit and the matching control unit execute the control operations based upon the selected error.

Furthermore, preferably, the wireless communication apparatus further comprises: an error averaging unit which averages the selected error; and both the power amplification control unit and the matching control unit execute the control operations based upon the averaged error.

Also, preferably, the wireless communication apparatus further comprises: a correction amount calculating unit which calculates a correction amount based upon the error; and a correction amount limiting unit which limits the calculated correction amount; and both the power amplification control unit and the matching control unit execute the control operations based upon the limited correction amount.

A transmission power control method, according to another aspect of the present invention, is featured by such a transmission power control method for controlling transmission power of the own communication station by employing a transmission power control bit which is sent from a counter communication station to the own communication station, comprising: control period changing step which changes a control period of the transmission power control bit.

Also, preferably, the transmission power control method further comprises: a transmission power control range changing step which changes a transmission power control range corresponding to the transmission power control bit.

Further, preferably, the transmission power control method further comprises: a condition detecting step which detects either a condition of the own station or a condition of the communication counter station; and the control period changing step changes the control period based upon the detected condition.

Also, preferably, the transmission power control method further comprises: a condition detecting step which detects either a condition of the own station or a condition of the communication counter station; and the control period changing step changes the control period based upon the detected condition; and the transmission power control range changing step changes the transmission power control range based upon the detected condition.

Also, a transmission power control method, according to a further aspect of the present invention, is featured by such a transmission power control method in which transmission power transmitted from the own communication station to a counter communication station is controlled by way of a first power amplifier and a second power amplifier, comprising: a gain control step which controls a gain of the first power amplifier; a matching step which matches a characteristic of the second power amplifier by way of a matching circuit; and a matching control step which controls the matching circuit.

Also, preferably, the transmission power control method further comprises: a transmission power detecting step which detects transmission power of the own communication station; a transmission power correcting step which corrects the detected transmission power in response to a communication condition of the own communication station; and an error calculating step which calculates an error between the corrected transmission power and target transmission power, wherein both the power amplification control step and the matching control step execute the control operations thereof based upon the calculated error.

Further, preferably, the transmission power control method further comprises an error selecting step which selects an error occurred in an effective control section from the plurality of errors which are calculated over a plurality of control sections, wherein both the power amplification control step and the matching control step execute the control operations based upon the selected error.

Furthermore, preferably, the transmission power control method further comprises an error averaging step for averaging the selected error, wherein both the power amplification control step and the matching control step execute the control operations based upon the averaged error.

Also, preferably, the transmission power control method further comprises: a correction amount calculating step which calculates a correction amount based upon the error; and a correction amount limiting step which limits the calculated correction amount, wherein both the power amplification control step and the matching control step execute the control operations based upon the limited correction amount.

In accordance with the present invention, when the transmission power of the own communication station is controlled by employing the transmission power control bit which is sent from the counter communication station to the own communication station, the control period of the transmission power control bit is changed. Also, the transmission power control range corresponding to the transmission power control bit is changed in connection with the change of the control period. Furthermore, both the control period and the transmission power control range are changed in response to either the communication condition of the own communication station or the communication condition of the counter communication station.

As a consequence, even when the transmission power control range is reduced so as to control the transmission power in high precision, the transmission power can be followed also with respect to the sudden change in the reception power, and thus, the control precision of the transmission power can be improved. Also, in accordance with the present invention, while such a high-precision variable power amplification control operation with employment of the high-precision variable power amplifier is no longer required, the transmission power control operation can be carried out in high precision by using the simple arrangement. As a consequence, the apparatus construction such as the variable power amplifier can be made compact, and furthermore, the low power consumption can be realized.

Also, in accordance with the present invention, while the transmission power is controlled by both the first power amplifier and the second power amplifier, which amplify the transmission power transmitted from the own communication station to the counter communication station, the gain of the first power amplifier is controlled, and also, the matching circuit for matching the characteristic of the second power amplifier is controlled. Also, the transmission power of the own communication station is detected, and the detected transmission power is corrected in accordance with the communication condition of the own station. While the calculation is made of the error between the corrected transmission power and the target transmission power, both the gain and the matching circuit are controlled based upon the calculated error. Furthermore, such an error occurred in the effective control section is selected from a plurality of errors which are calculated over a plurality of control sections, and then, both the gain and the matching circuit are controlled based upon the selected error. Furthermore, the selected errors are averaged, and then, both the gain and the control circuit are controlled based upon the averaged error. Moreover, while the correction amount is calculated based on the error, the calculated correction amount is limited. Thus, both the gain and the matching circuit are controlled based on this limited correction amount.

As a resulting, both the gain of the variable power amplifier functioning as the first power amplifier and also the matching operation of the characteristic of the semi-fixed power amplifier functioning as the second power amplifier can be controlled, so that the transmission power control operation can be carried out in higher precision. As a consequence, while such a high-precision variable power amplification control operation with employment of the high-precision variable power amplifier is no longer required, the transmission power control operation can be carried out in high precision by using the simple arrangement, so that the apparatus construction such as the variable power amplifier can be made compact, and furthermore, the low power consumption can be realized.

BRIEF DESCRIPTION OF THE DRAWINGS

FIG. 5 is a flow chart for explaining one method of the conventional transmission power control method by the closed loop.

DETAILED DESCRIPTION OF THE PREFERRED EMBODIMENT

Referring now to drawings, embodiments of the present invention will be described in detail.

Figure 1:
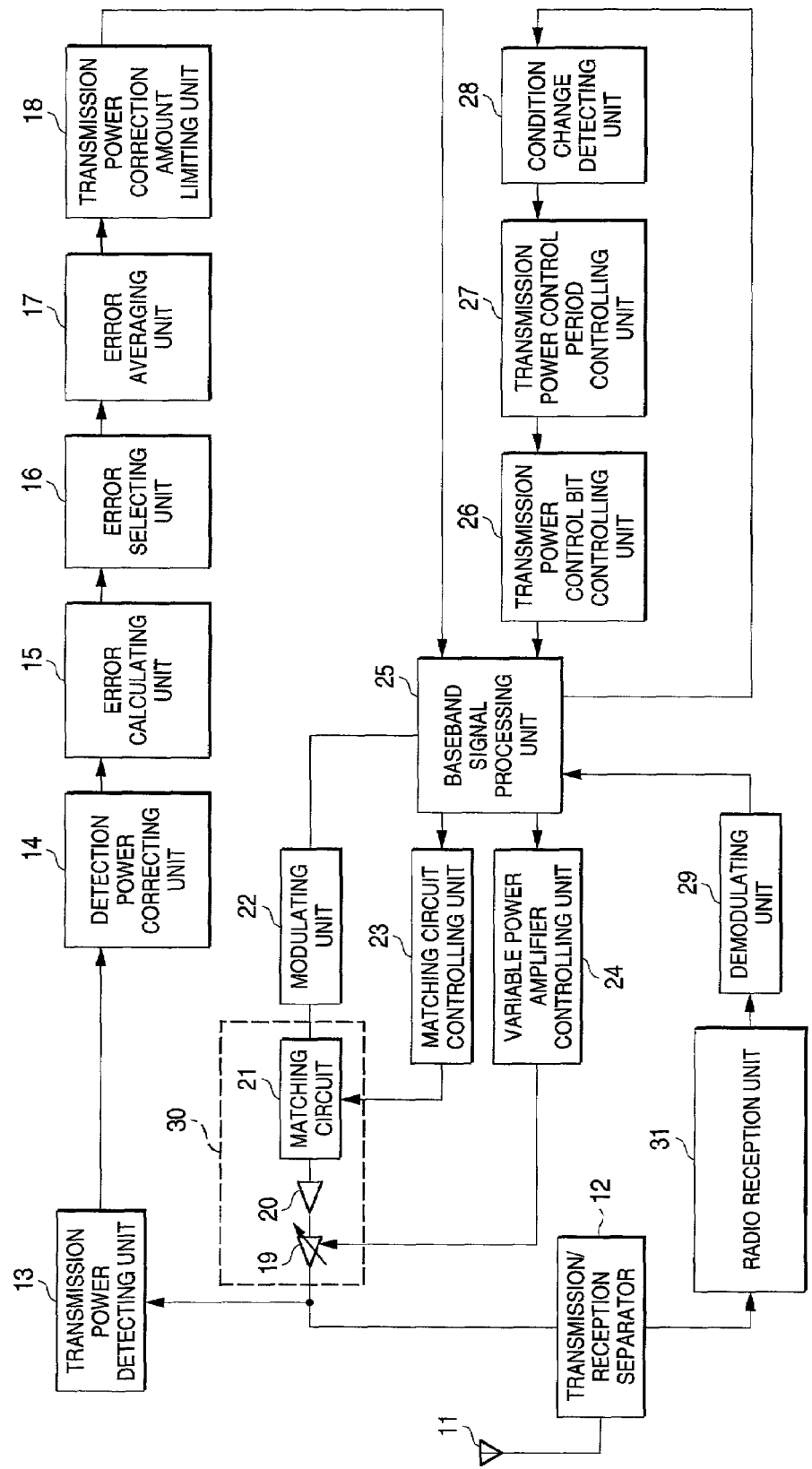
FIG. 1 is a block diagram for showing an arrangement of a major unit of a wireless communication apparatus according to an embodiment of the present invention.

FIG. 1 is a block diagram for indicating an arrangement of a major unit of a wireless communication apparatus according to an embodiment of the present invention.

The wireless communication apparatus, according to this embodiment, is provided in a mobile communication appliance which constitutes, for instance, either a base station or a mobile station of a cellular communication system. This wireless communication apparatus power-amplifies a signal containing transfer information, and then transmits the power-amplified signal to a communication counter party. A transmission power control method as described in this specification is suitably applied especially to such a case that while a high linearity is maintained over a wide power control range, a transmission power control operation should be carried out in high precision, as required in such a mobile terminal as a base station and a portable telephone in a CDMA type mobile communication system. Moreover, it should be understood that the wireless communication apparatus of this embodiment may be applied not only to a mobile communication appliance, but also other wireless communication apparatuses which require transmission power control operations similar to the above-described transmission power control operation.

This example represents only such an arrangement related to the transmission power control of the wireless communication apparatus. However, an arrangement related to other process operations is omitted (for instance, circuits and key inputs related to spreading, despreading, coding, decoding, telephone calling, telephone receiving, and controlling operations are omitted in a CDMA type portable telephone).

The wireless communication apparatus is arranged by containing an antenna 11 for transmitting/receiving a wireless signal, and a transmission/reception separator 12 for separating a transmission signal from a reception signal and vice versa. As a signal reception system, the wireless communication apparatus is arranged by including a wireless reception unit 31, a demodulating unit 29 for converting a reception signal into a baseband signal, and a baseband signal processing unit 25 for performing a signal processing operation and a signal decoding operation of a received baseband signal. The wireless reception unit 31 is provided with a high frequency amplifying circuit, a local oscillating circuit, an IF signal amplifying circuit, and the like, by which a reception signal is high-frequency-amplified, and also, this high-frequency-amplified signal is frequency-converted into an intermediate frequency (IF) signal.

Also, as a transmission system, this wireless communication apparatus is arranged by containing the above-explained baseband signal processing unit 25, a modulating unit 22, and a wireless transmission unit 30. The baseband signal processing unit 25 executes a signal processing operation, and a signal coding operation of a baseband signal to be transmitted. The modulating unit 22 modulates a transmission signal and then converts the modulated transmission signal into an IF (intermediate frequency) signal. The wireless transmission unit 30 power-amplifies the transmission signal, and frequency-converts the power-amplified transmission signal into an RF-band (radio frequency band) signal. This wireless transmission unit 30 contains a variable power amplifier 19, a power amplifier 20, and a matching circuit 21. The power amplifier 20 power-amplifies the transmission signal by a semi-fixed gain. The matching circuit 21 executes matching operations with respect to a gain, a current consumption, a noise characteristic, and a distortion characteristic of the power amplifier 20.

Furthermore, as a transmission power control system, the wireless communication apparatus includes the above-explained baseband signal processing unit 25, the variable power amplifier 19, the power amplifier 20, and the matching circuit 21, and also a variable power amplification control unit 24, a condition change detecting unit 28, a transmission power control bit controlling unit 26, and a transmission power control period controlling unit 27. The variable power amplification control unit 24 (i.e., power amplification controlling means) controls the gain of this variable power amplifier 19 so as to perform a transmission power control operation. The condition change detecting unit 28 (i.e., condition change detecting means) detects a communication condition change of a communication counter station and a communication condition change of the own communication station from a reception signal wave of the communication counter station outputted from the baseband signal processing unit 25 and also a communication condition of the own communication station. The transmission power control bit controlling unit 26 (i.e., transmission power control range changing means) changes a transmission power control range of a transmission power control bit based upon the output result of this condition change detecting unit 28. The transmission power control period controlling unit 27 (i.e., control period changing means) changes a transmission power control period based upon the output result of the condition change detecting unit 28.

Also, as a transmission power amplification control system, the wireless communication apparatus contains a transmission power detecting unit 13, a detection power correcting unit 14, an error calculating unit 15, an error selecting unit 16, an error averaging unit 17, a transmission power correction amount limiting unit 18, and a matching circuit control unit 23. The transmission power detecting unit 13 (i.e., transmission power detecting means) detects transmission power of a transmission signal of the own communication station, radiated from the antenna 11. The detection power correcting unit 14 (i.e., transmission power correcting means) corrects the transmission power detected by this transmission power detecting unit 13. The error calculating unit 15 (i.e., error calculating means) calculates an error between the transmission power corrected by this detection power correcting unit 14 and target transmission power. The error selecting unit 16 (i.e., error selecting means) selects an error of an effective control section from a plurality of errors which are outputted from this error calculating unit 15 over a plurality of control sections. The error averaging unit 17 (i.e., error averaging means) averages the selected error. The transmission power correction amount limiting unit 18 (i.e., correction amount calculating means and correction amount limiting means) calculates a correction amount with respect to the target transmission power, and also limits the calculated correction amount. The matching circuit control unit 23 controls the matching circuit 21 based upon the limited correction amount.

In such a case that the wireless communication apparatus with the arrangement shown in FIG. 1 corresponds to a mobile station, the condition change detecting unit 28 detects both a condition change of a base station and a change of an own station from the reception signal wave of the base station and the communication conditions of the own station, which are outputted from the baseband signal processing unit 25. Next, both the transmission power control period controlling unit 27 and the transmission power control bit controlling unit 26 change both the transmission power control period and the transmission power control range of the transmission power control bit based upon the output result of the condition change detecting unit 28.

Next, the baseband signal processing unit 25 determines a transmission power control bit based upon reception power of a reception signal wave (desirable signal wave) received from the base station, and then, inserts this determined transmission power control bit into the transmission signal. The transmission signal is modulated by the modulating unit 22, and the modulated transmission signal is frequency-converted into an IF-band transmission signal. Furthermore, this IF-band transmission signal is frequency-converted into an RF-band transmission signal, and thereafter, this RF-band transmission signal is transmitted via the transmission/reception separator 12 from the antenna 11 to the base station.

Also, after the transmission signal is detected by the transmission-power detecting unit 13, the detected transmission signal is corrected by the detection power correcting unit 14, so that an error with respect to the target transmission power is calculated by the error calculating unit 15. The calculated error is selected by the error selecting unit 16 and averaged by the error averaging unit 17, and thereafter, the resultant error is limited by the transmission power correction amount limiting unit 18 so as to constitute a correction amount with respect to the target transmission power.

On the other hand, a signal transmitted from the base station is received by the antenna 11, and then, this reception signal is entered via the transmission/reception separator 12 to the wireless reception unit 31. This reception signal is frequency-converted into an IF-band signal by the wireless reception unit 31, and this IF-band reception signal is converted into a baseband signal by the demodulating unit 29. Thereafter, this baseband signal is entered into the baseband signal processing unit 25. The baseband signal processing unit 25 extracts the transmission power control bit based upon the baseband signal outputted from the demodulating unit 29, and updates the target transmission power, and thereafter, corrects the target transmission power in accordance with the correction amount limited by the transmission power correction amount limiting unit 18. Then, both the variable power amplification control unit 24 and the matching circuit control unit 23 control the variable power amplifier 19 and the matching circuit 21 based upon the corrected target transmission power.

Figure 2:
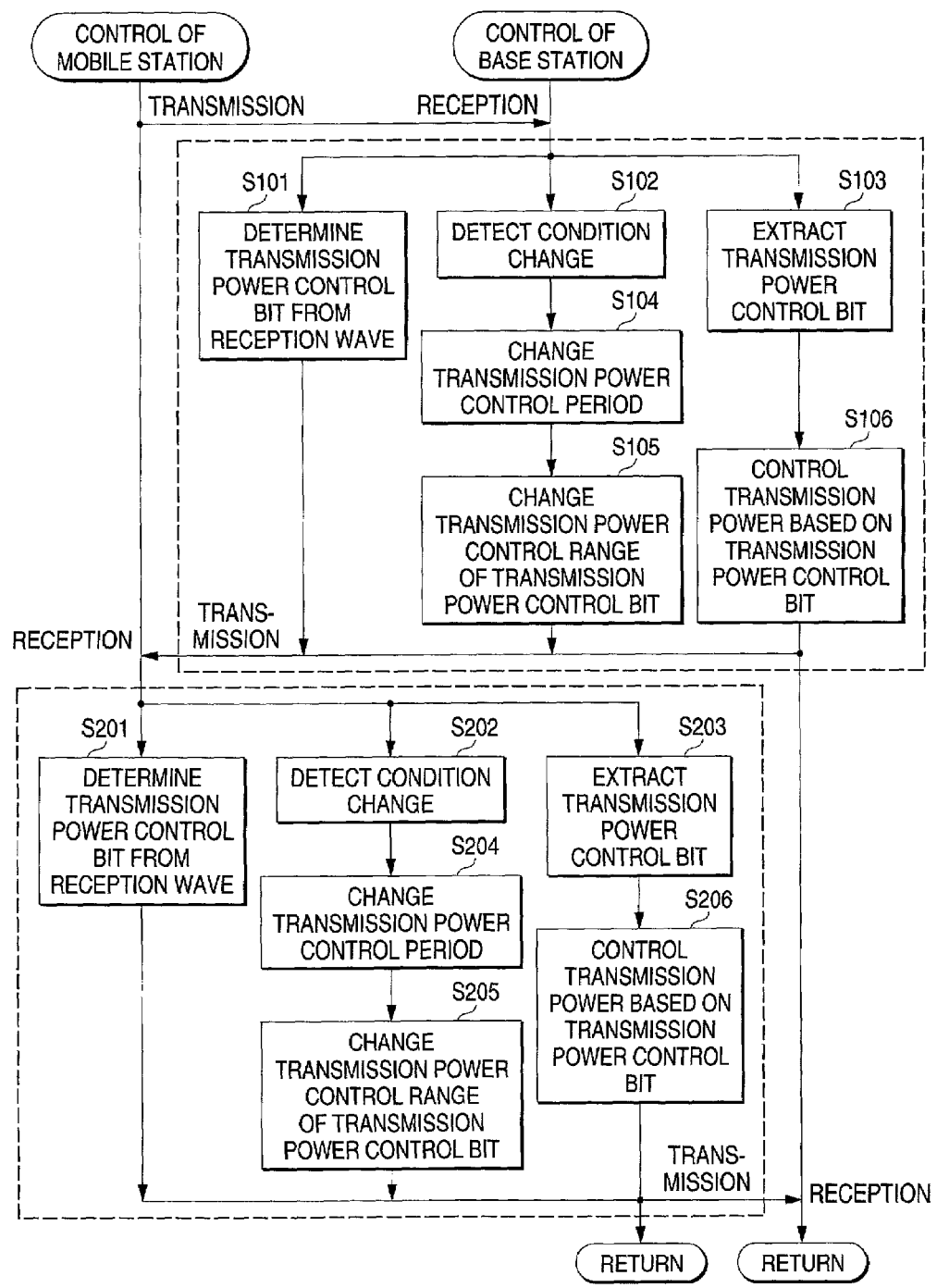
FIG. 2 is a flow chart for describing a sequential operation of a transmission power control method.

Next, a sequential operation of a transmission power control method according to this embodiment will now be explained more in detail. FIG. 2 is a flow chart for describing the sequential operation of the transmission power control method.

In FIG. 2, in the case that a mobile station is communicated with a base station, the base station determines a transmission power control bit based upon reception power of a reception signal wave (desirable signal wave) of the mobile station (S101). Then, both a change in communication conditions of the own communication station and a change in communication conditions of the counter communication station are detected (S102), and both the control period of the transmission power control bit and the transmission power control range are changed based upon the changes in the detected communication conditions (S104 and S105). Thereafter, this transmission power control bit is inserted into the transmission signal, and then, the resultant transmission signal is transmitted to the mobile station. On the other hand, the mobile station receives a signal transmitted from the base station, and extracts a transmission power control bit from the received signal (S203). Then, the transmission power of the own station is controlled in response to an instruction of the extracted transmission power control bit (S206).

Next, the mobile station detects a change in communication conditions of the own station and also a change in communication conditions of the communication counter station based upon the reception signal wave of the base station and the communication condition of the own station, which are outputted from the baseband signal processing unit 25, namely, the reception power, the transmission power, the transmission power control bit, the change amount of the control condition, and the change speed (S202). The control period of the transmission power control bit is changed in response to this detection result (S204).

For instance, in such a case that both the change amount of the reception power and the change speed of this reception power are detected at the step S202, and then the larger both the detected change amount of the reception power and the detected change speed thereof are increased, the shorter the control period of the transmission power control bit at the step S204 is reduced, the rapid, or sudden variation of the reception power can be followed. As a result, the precision of the transmission power control operation can be improved.

In other words, in the case that the transmission power of the base station is wanted to be suddenly controlled at the step S204 by the mobile station, since the transmission power control period is shortened, the following precision of the transmission power with respect to the desirable power can be increased, whereas when the transmission power of the base station is wanted to be gently controlled, since the control period of the transmission power is prolonged, the following precision of the transmission power with respect to the desirable power can be increased. As a result, the precision of the transmission power control operation can be improved, as compared with the conventional method for fixing the control period of the transmission power.

Then, the mobile station changes the transmission power control range in response to the communication condition changes of the own station and also of the counter station detected at the step S202 (S205). For example, in such a case that both the change amount of the reception power and the change speed of this reception power are detected at the step S202, and then the larger both the detected change amount of the reception power and the detected change speed thereof are increased, the wider the control range of the transmission power control bit is increased, the rapid, or sudden variation of the reception power can be followed. As a result, the precision of the transmission power control operation can be improved.

In other words, in the case that the transmission power of the base station is wanted to be rapidly controlled at the step S205 by the mobile station, since the transmission power control range is widened, the following precision of the transmission power with respect to the desirable power can be increased, whereas when the transmission power of the base station is wanted to be gently controlled, since the control range of the transmission power is narrowed, the following precision of the transmission power with respect to the desirable power can be increased. As a result, the precision of the transmission power control operation can be improved, as compared with the conventional method for fixing the control period of the transmission power.

As previously explained, in the case that the mobile station wants to rapidly control the transmission power of the transmission power, the control range of the transmission power is widened (increased) at the step S205, and further, the control period of the transmission power is shortened at the step S204, so that the control section of this transmission power control range is shortened. As a result, the mutual effect can be improved. As a consequence, a total number of calculations executed in the base station can be reduced, and the wireless communication apparatus can be made simpler, and can be operated under low power consumption.

On the other hand, in such a case that the mobile station wants to gently control the transmission power of the transmission power, the control range of the transmission power is similarly narrowed (reduced) at the step S205, and further, the control period of the transmission power is prolonged at the step S204, so that the control section of this transmission power control range is prolonged. As a result, the mutual effect can be improved. As a consequence, the transmission power control resolution in the base station can be reduced, and the wireless communication apparatus can be made simpler, and can be operated under low power consumption.

Next, the mobile station determines a transmission power control bit from the reception signal wave (step S201), and inserts the determined transmission power control bit into the transmission signal, and thereafter, transmits the resultant transmission signal to the base station. On the other hand, the base station receives a signal transmitted from the mobile station and extracts the transmission power control bit from this reception signal (S103). In response to the instruction of the transmission power control bit, the mobile station controls the transmission power of the own station (S106).

It should be noted that the process operations defined at the steps S102, S104, and S105, which are executed in the base station, are similar to those defined at the steps S202, S204, and S205, which are executed in the mobile station. Since these process operations are executed in the base station, the following precision of the transmission power with respect to the desirable power can be increased similar to the mobile station. As a result, the precision of the transmission power control can be improved.

As previously explained, in accordance with this embodiment, since both the transmission power control range and the control period with respect to the transmission power control bit are changed in response to the change in the communication conditions of the own station and also the change in the communication conditions of the counter station, the rapid variations in the reception power can be followed even when the transmission power control range is reduced, or narrowed so as to control the transmission power in high precision. As a consequence, the precision of the transmission power control operation can be improved.

Also, in order to perform the high precision control of the transmission power, both the high-precision variable power amplifier and the high-precision variable power control unit are no longer required. Also, since the required transmission power can be minimized by improving such precision of the transmission power control operations realized in the base station and the mobile station, the wireless communication apparatus can be operated under low power consumption and can be made compact.

Figure 3:
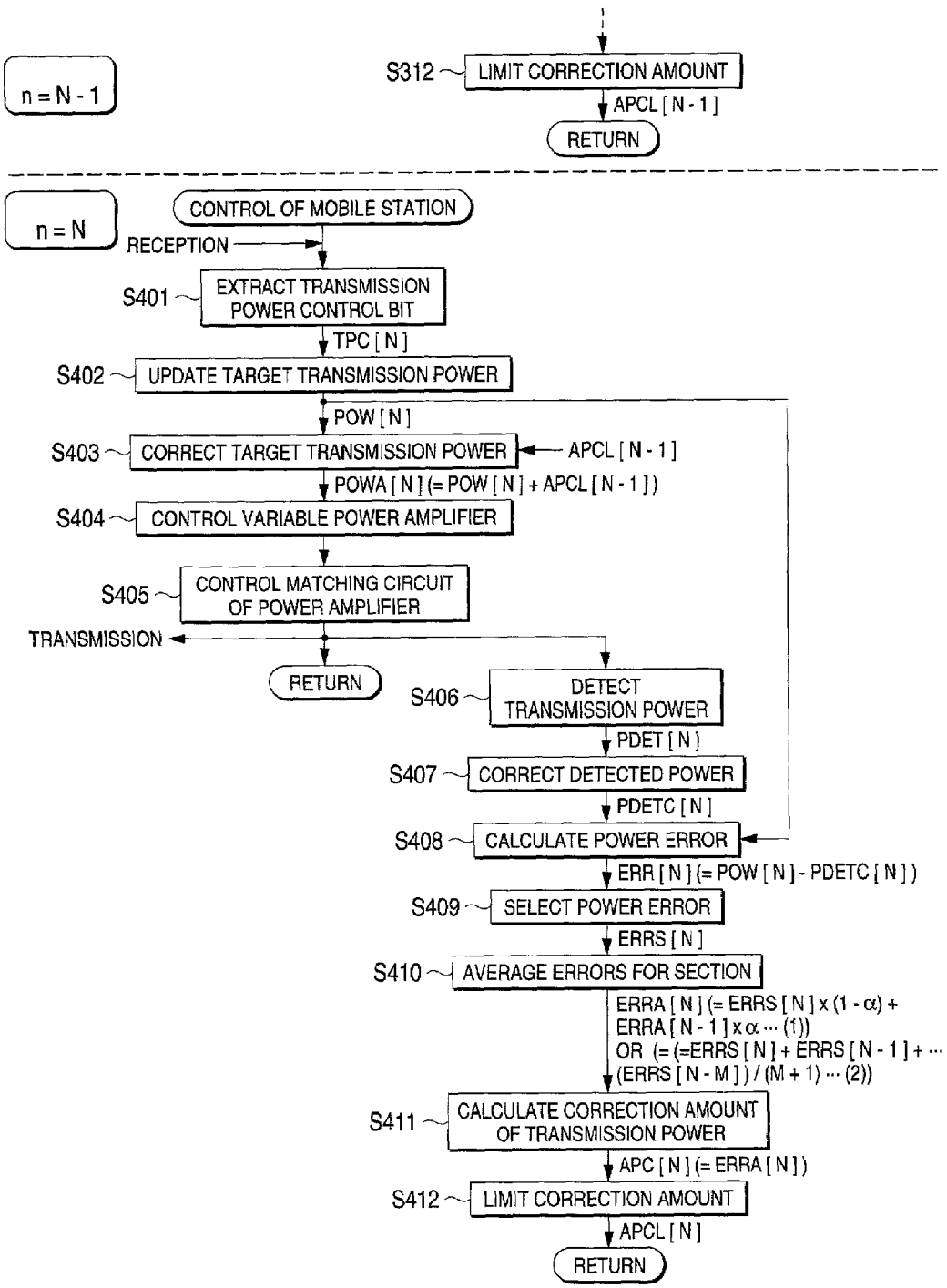
FIG. 3 is a flow chart for describing a sequential operation of a transmission power amplification control operation executed in a mobile station.
Figure 4:
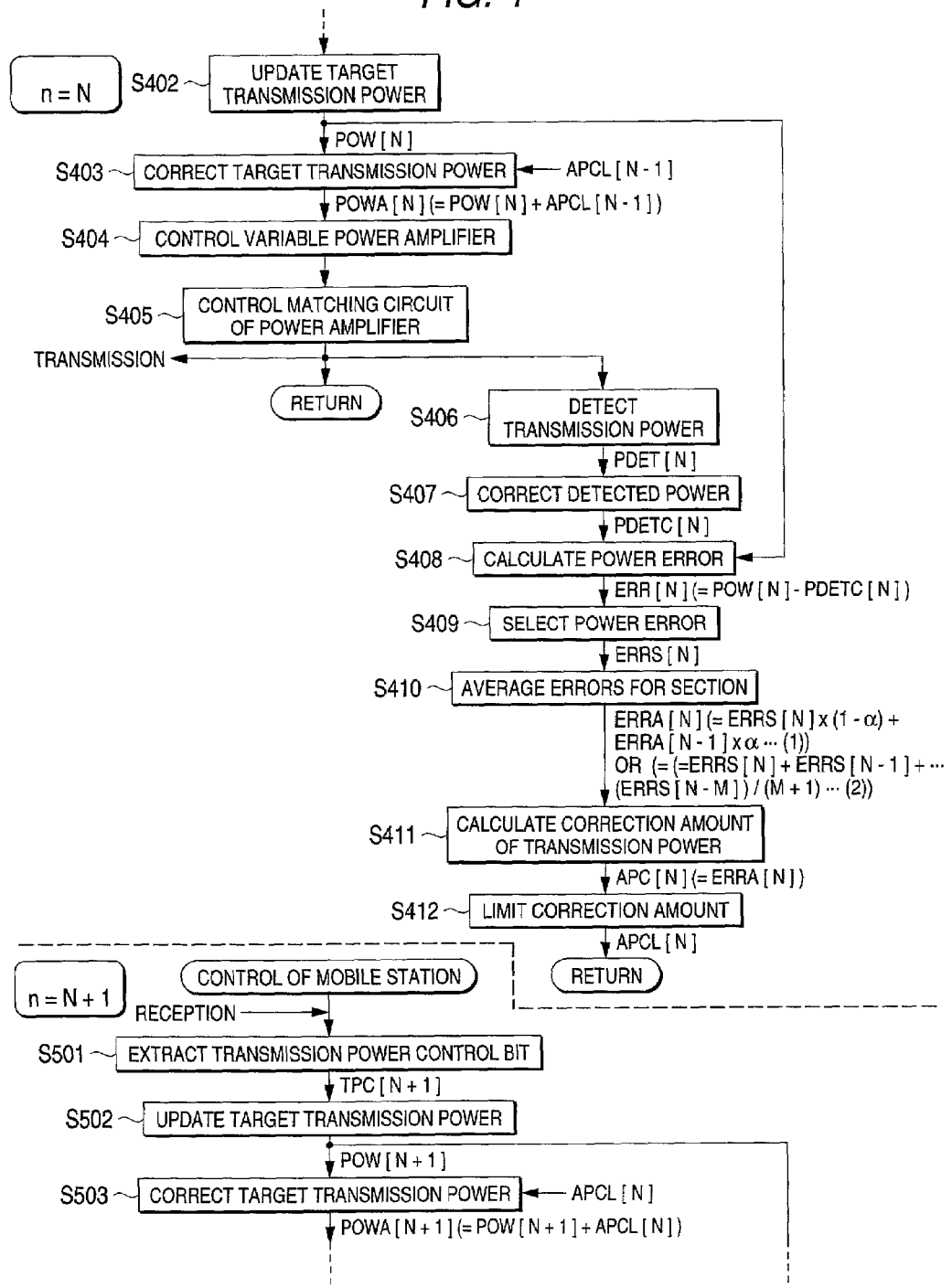
FIG. 4 is a flow chart for explaining a sequential operation of the transmission power amplification control operation executed in the mobile station, which is continued to that of FIG. 3.

Next, a description will now be made of a transmission power amplification control sequential operation, while a transmission power control operation of a mobile station is employed as an example. FIG. 3 and FIG. 4 are flow charts for describing transmission power amplification control sequential operations executed in the mobile station. This amplification control of the transmission power is repeatedly carried out. In this embodiment, a present execution of such a transmission power amplification control is expressed by "n=N" by employing a total time "n", and also, a preceding execution thereof and a succeeding execution thereof are represented as "n=N−1" and "n=N+1", respectively.

First, when the mobile station receives a signal transmitted from the base station, this mobile station extracts a transmission power control bit TPC [N] of the present execution (step S401), and then, updates a target value of transmission power (target transmission power) POW [N] of the own mobile station (step S402). Furthermore, the mobile station corrects the target value of the transmission power by adding the transmission power correction amount APCL [N−1] calculated at the step S312 during the preceding execution of the transmission power amplification control to this target transmission power POW [N] (step S403). Thus, this corrected target value is used as target transmission power POWA [N].

Then, the mobile station controls both the variable power amplifier 19 and the matching circuit 21 of the power amplifier 20 in accordance with this corrected target transmission power POWA [N] (steps S404 and S405).

At this step S405, since the mobile station controls the matching circuit 21 of the power amplifier 20, this mobile station is capable of varying the matching operations of the gain, the current consumption, the noise characteristic, and the distortion characteristic of the power amplifier 20. As a consequence, since the mobile station controls the matching circuit 21 of the power amplifier 20 in response to the target transmission power POWA [N], the wireless communication apparatus can be operated under low power consumption, as compared with such a conventional method that the matching circuit is fixed.

For instance, when an absolute value of the target transmission power is small, since an input voltage of the power amplifier 20 is lowered, both the gain and the distortion characteristic of this power amplifier 20 can be improved. The matching circuit 21 may be controlled in such a manner that both the margin of the gain and the distortion characteristic are allocated to the reduction of the current consumption and the improvement of the noise characteristic. On the other hand, when an absolute value of the target transmission power is large, since an input voltage of the power amplifier 20 is high, the noise characteristic of the power amplifier 20 can be improved. The matching circuit 21 may be controlled in such a manner that the spared portion of the noise characteristic is allocated to both the reduction of the current consumption and the improvement of the distortion characteristic.

Furthermore, since the gain of the power amplifier 20 is controlled in response to the target transmission power, the power control range of the variable power amplifier 19 is reduced. As a result, the variable power amplifier can be made compact, the wireless communication apparatus can be made simple and also can be operated under low power consumption. This control operation may be applied not only to the amplification control of the transmission power, but also to the amplification control of the reception power.

Next, the mobile station detects transmission power PDET [N] of the own station (step S406), corrects this detected transmission power (detection power) PDET [N] in accordance with the communication condition of the own station in a proper manner (step S407), and then constitutes this corrected power as corrected detection power PDETC [N]. At this step S407, the mobile station may properly correct the detection power in response to a temperature of the own communication station, a power supply voltage thereof, a transmission frequency thereof, a spreading rate of a transmission signal thereof, a code multiple number of the transmission signal thereof, and a peak value of transmission power thereof. As a consequence, since the mobile station corrects the detected power PDET [N] in order to obtain constant detection power irrespective of various changes in the temperature of the own station, the power supply voltage thereof, the transmission frequency thereof, the spreading rate of the transmission signal thereof, the code multiple number of the transmission signal thereof, and also the peak value of the transmission power thereof, the detection precision of the transmission power can be increased, and also the control precision of the transmission power control operation can be increased.

Also, at a step S407, the mobile station may correct the detected power in response to environmental changes in a proper manner. As a result, while the apparatus is not changed also with respect to a new environmental changing factor, since the coefficient of the digital filter is changed, the mobile station may correct the detection power PDET [N] in accordance with the environmental change. Therefore, the wireless communication apparatus can be made simple, and can be operated under low power consumption.

Then, the mobile station calculates an electric power error ERR [N] (=POWN [N]−PDETC [N]) every control section from a difference between the detection power PDETC [N] corrected at the step S407 and the target power POWN [N] (step S408), and also selects the power error ERR[N] calculated every control section (step S409). At this step S409, the mobile station selects only such a power error ERR [N] in an effective control section of the detection power PDETC [N] to constitute this selected power error as a power error ERRS [N]. As a result, since a selection is made of the power error ERRS [N] in the data transmission section during the high transmission power, and also the power error ERRS [N] in the data transmission section during the DTX (Discontinuous Transmission) control, the detection precision of the power errors can be increased, and also the precision of the transmission power control can be improved.

Next, the mobile station averages the power errors ERRS [N] selected at the step S409 over the control section (step S410). At this step S410, the mobile station calculates an average value ERRA [N] in accordance with a move average formula shown in the below-mentioned formula (1), or an averaging formula with employment of a forget coefficient indicated in the below-mentioned formula (2):

$$ERRA[N]=(ERRS[N]+ERRS[N-1]+,\ldots,+ERRS[N-M])/(M+1) \quad (1)$$

$$ERRA[N]=ERRS[N]\times(1-\alpha)+ERRA[N-1]\times\alpha \quad (2).$$

As previously explained, since the power errors are averaged, the variation contained in the power errors is reduced, so that the precision of the transmission power control operation can be improved.

Also, in the no data transmission sections during the low power consumption and the DTX control operation, the mobile station may correct the transmission power of the own station by employing the error ERRA [N] which is averaged over the control section at the step S410, so that the precision of the transmission power control operation can be improved.

Then, the mobile station calculates a transmission power correction amount APC [N] by employing the error ERRA [N] averaged at the step S410 (step S411), and then limits this transmission power correction amount APC [N] (step S412) to set this limited transmission power correction amount as a transmission power correction APCL [N]. In this case, it is so assumed that the transmission power correction amount APC [N] is equal to the error ERRA [N]. Also, at this step S412, the mobile station limits the transmission power correction amount in order that the control amount per 1 control operation does not exceed a limit value DAPC [dB] For instance, in such a case that an absolute value of necessary increased/decreased power per 1 control operation is 1 dB, an absolute value of allowable minimum increased/decreased power is 0.6 dB, and also an absolute value of allowable maximum power is 1.4 dB, the mobile station may set the limit value DAPC to be smaller than, or equal to 0.4 dB. As explained above, since the transmission power correction amount per 1 control is limited, the relative precision of the transmission power control operation can be increased, so that the precision of the transmission power control operation can be improved.

The process operations defined at the steps S501, S502, and S503 and executed in the transmission power control operation when the subsequent operation (n=N+1) is executed are similar to those defined at the steps S401, S402, and S403 and executed in the transmission power control when the present operation (n=N) is executed. Subsequently, since the similar process operations defined at the steps S401 to S412 are repeatedly carried out, the transmission power control operation is carried out. Since the transmission power control operation is carried out in the above manner, the precision of the transmission power control operation can be further improved. As a result, the wireless communication apparatus can be made simple and can be operated under low power consumption.

As previously described, in accordance with this embodiment, even when the transmission power control range is reduced so as to control the transmission power in high precision, the transmission power can be followed also with respect to the sudden change in the reception power, and thus, the control precision of the transmission power can be improved.

Also, while the transmission power of the own station is detected, based upon the detected transmission power, both the gain of the variable power amplifier functioning as the first power amplifier and also the matching operation of the characteristic of the semi-fixed power amplifier functioning as the second power amplifier can be controlled, so that the transmission power control operation can be carried out in higher precision.

Also, in accordance with this embodiment, while such a high-precision variable power amplification control operation with employment of the high-precision variable power amplifier is no longer required, the transmission power control operation can be carried out in high precision by using the simple arrangement, so that the apparatus construction such as the variable power amplifier can be made compact, and furthermore, the low power consumption can be realized.

As previously described, in accordance with the present invention, there are such effects that the transmission power control operation can be carried out in high precision with employment of the simple arrangement, and the wireless communication apparatus can be operated under low power consumption and also can be made compact.

What is claimed is:

1. A wireless communication apparatus having a transmission power control function used to control said transmission power, comprising:
    a first power amplifier and a second power amplifier which amplify transmission power transmitted from the apparatus to the communication counter station;
    a power amplification control unit which controls a gain of said first power amplifier;
    a matching unit which performs a matching operation of a characteristic of said second power amplifier on an input to said second power amplifier; and
    a matching control unit which controls said matching unit.

2. A wireless communication apparatus as claimed in claim 1, wherein the characteristic of the second power amplifier is at least one of a gain, a current consumption, a noise characteristic, and a distortion of the second power amplifier.

3. A wireless communication apparatus as claimed in claim 1 further comprising:
    a transmission power detecting unit which detects transmission power of the apparatus;
    a transmission power correcting unit which corrects the detected transmission power in response to a communication condition of the apparatus;
    and an error calculating unit which calculates an error between the corrected transmission power and target transmission power,
    wherein both said power amplification control unit and said matching control unit execute the control operations thereof based upon the calculated error.

4. A wireless communication apparatus as claimed in claim 3 further comprising:
    a correction amount calculating unit which calculates a correction amount based upon the error; and
    a correction amount limiting unit which limits the calculated correction amount, wherein
    both said power amplification control unit and said matching control unit execute the control operations based upon the limiting correction amount.

5. A wireless communication apparatus as claimed in claim 3 further comprising an error selecting unit which selects an error occurred in an effective control section from the plurality of errors which are calculated over a plurality of control sections, wherein both said power amplification control unit and said matching control unit execute the control operations based upon the selected error.

6. A wireless communication apparatus as claimed in claim 5 further comprising an error averaging unit which averages the selected error, wherein both said power amplification control unit and said matching control unit executes the control operations based upon the averaged error.

7. A transmission power control method in which transmission power transmitted from a communication apparatus to a counter communication station is controlled by way of a first power amplifier and a second power amplifier, comprising steps of:
controlling a gain of the first power amplifier; matching a characteristic of the second power amplifier by way of a matching circuit on an input to said second power amplifier; and
controlling the matching circuit using a matching control unit.

8. A transmission power control method as claimed in claim 7, wherein the characteristic of the second power amplifier is at least one of a gain, a current consumption, a noise characteristic, and a distortion of the second power amplifier.

9. A transmission power control method in which transmission power transmitted from a communication apparatus to a counter communication station is controlled by way of a first power amplifier and a second power amplifier, comprising steps of:
controlling a gain of the first power amplifier;
matching a characteristic of the second power amplifier by way of a matching circuit on an input to said second power amplifier;
controlling the matching circuit; detecting transmission power of the apparatus;
correcting the detected transmission power in response to a communication condition of the apparatus; and
calculating an error between said corrected transmission power and target transmission power,
wherein the first amplifier and the matching circuit are controlled based upon the calculated error.

10. A transmission power control method as claimed in claim 9 further comprising steps of:
calculating a correction amount based upon the error; and
limiting said calculated correction amount, wherein
the first amplifier and the matching circuit are controlled based upon the limited correction amount.

11. A transmission power control method as claimed in claim 9 further comprising a step of selecting an error occurred in an effective control section from the plurality of errors which are calculated over a plurality of control sections, wherein the first amplifier and the matching circuit are controlled based upon the selected error.

12. A transmission power control method as claimed in claim 11 further comprising a step of averaging the selected error, wherein the first amplifier and the matching circuit are controlled based upon said averaged error.

* * * * *